United States Patent
Dong

(10) Patent No.: US 10,031,998 B2
(45) Date of Patent: Jul. 24, 2018

(54) METHOD AND DEVICE FOR SIGNAL PERIOD STRETCH AND ULTRA-FAST SERIAL-TO-PARALLEL/PARALLEL-TO-SERIAL CONVERSION

(75) Inventor: Shi Dong, Chongqing (CN)

(73) Assignee: CHONGQING MISEN TECH LTD., Chongqing (CN)

( * ) Notice: Subject to any disclaimer, the term of this patent is extended or adjusted under 35 U.S.C. 154(b) by 1208 days.

(21) Appl. No.: 13/515,995

(22) PCT Filed: Nov. 2, 2011

(86) PCT No.: PCT/CN2011/001849
§ 371 (c)(1),
(2), (4) Date: Aug. 30, 2012

(87) PCT Pub. No.: WO2012/058865
PCT Pub. Date: May 10, 2012

(65) Prior Publication Data
US 2013/0211789 A1 Aug. 15, 2013

(30) Foreign Application Priority Data

Nov. 4, 2010 (CN) .......................... 2010 1 0531695

(51) Int. Cl.
*G06F 19/00* (2018.01)
*H03M 9/00* (2006.01)
*G01S 7/48* (2006.01)

(52) U.S. Cl.
CPC .............. *G06F 19/00* (2013.01); *H03M 9/00* (2013.01); *G01S 7/48* (2013.01)

(58) Field of Classification Search
CPC .............. H03M 9/00; G01S 7/48; G06F 19/00
See application file for complete search history.

(56) References Cited

U.S. PATENT DOCUMENTS 2,538,541 A * 1/1951 Tourshou ................. H03K 4/16
30/41.5
3,483,387 A * 12/1969 Luther, Jr. .............. G01S 13/28
250/216

(Continued)

FOREIGN PATENT DOCUMENTS

| CN | 1118932 A | 3/1996 |
| CN | 1547672 A | 11/2004 |
| CN | 102098094 A | 6/2011 |

OTHER PUBLICATIONS

Helguera, An Introduction to Ultrasound, 2009, p. 1-11.*

(Continued)

*Primary Examiner* — Alexander Satanovsky
*Assistant Examiner* — Lina Cordero
(74) *Attorney, Agent, or Firm* — Kilpatrick Townsend & Stockton, LLP; Charles Gray

(57) ABSTRACT

Disclosed are a method and a device for signal period stretch and ultra-fast serial-to-parallel/parallel-to-serial conversion, which relate to the technical field of analysis and measurement control. The method is to change a propagation velocity of a target signal or displacement-reflecting the target signal, so as to extend or compress the period of the signal. Displacement-reflection is to generate a Doppler shift through interaction of the displacement of a reflecting plate with the target signal, so as to achieve period stretch; for a signal transmitted through a medium, the propagation velocity of the target signal is changed by changing the property of the medium, so as to achieve period stretch; for a signal ascribed to an electron flow, the movement velocity of the electron beam is changed through a varying acceleration field, so as to achieve period stretch. A target signal condensing/diffusing and collimating lens, a synchronous signal controller and a plurality of period stretch devices are utilized to achieve ultra-fast serial-to-parallel/parallel-to- (Continued)

serial signal conversion. Thereby, a device that originally cannot work at the frequency spectrum of the target signal is enabled to observe, transmit and parse content of the original target signal.

9 Claims, 9 Drawing Sheets

(56) References Cited

U.S. PATENT DOCUMENTS

| | | | | |
|---|---|---|---|---|
| 4,035,760 | A | * | 7/1977 | Asbury ................ G01S 13/585 342/109 |
| 4,389,590 | A | * | 6/1983 | Whitlock ................ G01D 9/00 257/416 |
| 5,602,677 | A | * | 2/1997 | Tournois .............. G02B 6/2861 359/566 |
| 2002/0011576 | A1 | * | 1/2002 | Cho ..................... G11B 5/6005 250/559.37 |
| 2007/0071039 | A1 | * | 3/2007 | Bang ..................... H04J 3/0685 370/535 |
| 2008/0170633 | A1 | * | 7/2008 | Karino ................. H04L 5/0007 375/260 |

OTHER PUBLICATIONS

Boyd, Controlling the Velocity of Light Pulses, Nov. 2009, p. 1074-1077.*

Anonymous, Ultrasound, University of Washington, 2006, p. 1-24.*

Olympus, Ultrasonic Transducers Technical Notes, 2007.*

Yang, Yun-Jing et al., "Multiplier effect of pulsed electric field=mediated plant negative air ion launched and its significance," China Academic Journal Electronic Publishing House, vol. 28, No. 12, Dec. 2009.

* cited by examiner

METHOD AND DEVICE FOR SIGNAL PERIOD STRETCH AND ULTRA-FAST SERIAL-TO-PARALLEL/PARALLEL-TO-SERIAL CONVERSION

FIELD OF THE INVENTION

The invention relates to the field of analysis and measurement control technology, and more particularly to fast signal processing method (Time stretch), and also relates to high-speed data transmission in communications engineering field, and optical and nuclear engineering.

BACKGROUND OF THE INVENTION

In daily life or scientific and technological research, we often need to speed up the slow changing process, so that we can quickly understand all the process in general, or we need to slow down the fast changing process, so that we can find out any specific changes in detail in the changing process, which is called time stretch. Based on the application of the time stretch, there is a fast sampling technique based on a narrow pulse control signal which is usually used to rapid physical field of research, such as blasting, nuclear electronics, elementary particle movement characteristics, as well as a photoelectric signal sampling oscilloscope. However, the sampling technique is restricted by the sampling time which may become the limits of its temporal resolution. Thus, some details in the time that is smaller than the sampling time can not be distinguished, and the details will be attenuated and annihilated after sampling processing. In addition of the information sampling technique, the time measurement technology used for the time interval measurement is also used for time stretch to achieve higher temporal resolution. The commonly used method includes: converting the time quantum to other physical quantities according to the characteristic of the measured signal, or indirectly enlarging measured signal based on the asymmetry of the signal establishment and release. However, the former is limited by response time of the conversion devices and is not directly used to the original signal, while the latter can not further parse multiple objects and more details.

In order to further illustrate the problems of the time stretch technology, several common techniques are analyzed as following.

The sampling technique is an important means to study the fast physical, which commonly includes a high-speed photography and optical sampling oscilloscope. The former is mainly used to take a picture for the fast moving object, which has a relatively long sampling interval, where the picture is commonly flat image information (referring to: Li, Jing-Zhen, 迈向原子时间分 辨的时间放大技术, Science in China Series E: Technological Sciences, 2009, 39(12): 1887-1904 ISSN: 1006-9275). The latter is mainly used for signal testing in optoelectronics engineering, which has a relatively short sampling interval (usually approximates a continuous signal) and includes a single or multiple channels (referring to: Zhou Xuan, Li Jin-Lin and Bao Bing-Qian, 高速电光信号的捕捉和 记录——微微秒 光取样和高速摄影 Electronic Measurement Technology, Issued 02, 1984, ISSN: 1002-7300.0.1984-02-000).

Both of these applications must use the narrow pulse signal with a short period, which is also the limit of the temporal resolution of the measured signals. Even if the fast-changing physical process can be slowly displayed to achieve the purpose of understanding the details of the changing process, the two applications need the sampling signal or response time with the shorter period than the observed objects, thus limiting our observation for the high-speed changing objects. Even if the period of the observed objects is consistent with that of the sampling signal or response time, we can not get the details of the observed objects. Thus, the time stretch technology based on the sampling technique is not (partially) stretch the time actually, which is need rely on the narrow pulse signal with a shorter period, while the change rate of the observed objects to the observer/receiver remains unchanged. In addition, the technology is irreversible and can only be used to obtain detailed contents rather than compressed information.

Time conversion technique is usually used to the time-to-digital converter (TDC), the vernier timer, the time-to-amplitude converter (TAC), the delay line coding technique and the interpolation technique, which is based on pulse time interval measurement.

(1) The interpolation technique is based on the sum and difference of the inherent delay time of the device and the time interval of the signal to increase the time interval of the signal, and the logical operations and capacitor charging/discharging is operated to achieving the delayed amplification of the signal and finally realize the effect of expanding the time interval. The interpolation technique can also be called as time interval replication technology, and the proportional amplification of the pulse interval is still achieved by using the asymmetry of the signal paths. This technology can not directly amplify the time interval of the original signals, which is achieved after a number of middle conversions. Except for the measurement of a single time interval signal, the interpolation technique can not be used for other occasions.

(2) The delay line coding technique can be achieved based on the states when the inherent time difference of the signal transmission circuit reaches the gate circuit and when a synchronous clock locking signal reaches each gate circuit. This technology is only designed to reduce the frequency of the count clock, the time interval of the measured signal is not expanded, and the resolution of the time interval is improved only depending on the shorter response time of the circuits.

(3) TAC technique is an indirect measurement method that uses the characteristics of the signal amplitude changing with time and estimate the time interval by measuring the amplitude and/or phase, which is also the basis of time-digital converter. However, because the TAC technique does not directly measure the time interval, this technique depends on the continuous and stable change of the signal amplitude of the foregoing components and the strict correlation between the time interval and the amplitude.

(4) TDC, such as Wilkinson-type TDC, is achieved by time-to-amplitude conversion and then by amplitude-to-digital conversion. In addition to the comprehensive application of the aforementioned methods, the asymmetry for signal establishment and release may be used as the starting of the time stretch processing, which can proportionally amplify the time interval. However, this method still can not amplify the time interval directly, but achieve the amplified time interval indirectly according to the electrical characteristics of the accumulation and release process of the charges on the capacitor. Thus, there is a strict demand of the capacitor and the charging/discharging circuits, and a poor anti-interference. This time interval amplification technology usually exists time dead-zone, and can not effectively process multiple target signals (more than one time interval signal) and the continuous changing analog signal.

Some devices similar to the TDC, such as, digital video, film, voice decoder are also usually used for the time stretch technology. However, on the one hand, the information is a record of the original signal, rather than represents the actual contents of the original signal. On a more basic level, when the information is saved, the original signal is used as control variable to influence the state of other substances, and the characteristics of the original signal is responded by the state of other substances. On the other hand, the method for receiving/transmitting digital coding at different rates is usually used, and the detail portion of the signal after the digital coding (sampling techniques) has been lost (limited by the sampling pulse frequency). Therefore, they can not reflect the actual results of the time stretch processing of the original signal.

In summary, the foregoing time stretch technologies can not achieve a good compatibility on direct processing, nonrestraint of response time, process of analog signal process of multiple time interval objects on the same channel, the reversible transformation and the smaller lossless signal details. In addition, most of the programs do not really change the local time of the observed objected and the observer/receiver.

SUMMARY OF THE INVENTION

The purpose of the present disclosure generally is to expand or shrink a period of target signal sent from an external signal source directly, wherein the signal with the expanded period is the target signal itself; the expanded or shrunk period comprises the time interval of continuous target signal in the time and the time interval of intermittent target signal in the time. The essence of expanding or shrinking a period of target signal is to change action rate between the target signal and observer/receiver by a target signal speed changer or by a displacement reflection target signal, which is based on a method for performing a possible change of a propagation speed of the target signal by a speed changer or a method for performing Doppler shift to the displacement reflection target signal. Specifically, the method for the speed changer being possible to change the propagation speed also includes: changing a distance between the starting and end of the target signal by applying a changing acceleration field and changing the property of a medium to transmit the target signal in the medium at different speeds. It is considered that the physical feature and property of the signal is changed after the change of the spectrum. A solution of implementing the above period stretch ratio may be a combination of the above three basic solutions. For example, the electromagnetic wave of the infrared band is converted into electronic signal of fast-level frequency. Electronic component doesn't work in the infrared band, while the fast-level frequency will make the size of non-electronic component solutions too large to apply in actual products. However, if the Doppler shift or the controlled medium is used as a processing front-end of the signal period expansion, an electromagnetic-electrical signal conversion device is attached, and finally the electronic tube implements the solution of the signal period expansion. Thus, three basic solutions are only the component unit for implementing the period stretch. A specific combination required for implementing a determined period stretch ratio is determined according to the requirement of the application system.

The principle is described as follows.

In the present invention, three basic solution is provided according to the type of the signal which can be affect by the other objects: the first type of the signal is a reflexible target signal; the second type of the signal is the target signal which can be transmitted by the medium; the third type of the signal is the target signal which can be accelerated by an accelerating field. Since the target signal to be processed may be the signal with a long life cycle or an uncertain arrival time, the first three basic solutions may not meet the demand. Therefore, the present invention also provides a combination solution of the first three programs. In other words, the period of the target signal is continuously stretched by using multiple devices for the signal period stretch which is operated in different and cyclically adjacent time intervals (cyclically adjacent time intervals means that the forward work of the first channel has been finished or will be started once the forward work of the last channel is finished, in which the forward work in the present invention is defined as the operation for performing a preset process <shrinking or expanding>, while a backward work is defined as the operation for performing an inverse process <expanding or shrinking>), and the serial input target signal is converted into the segmented parallel output signals; or the period of the multi-channel parallel input target signal is shrunk, the shrunk target signal is serialized and interleaved to align them in the same channel, and finally the aligned target signal is outputted. The present disclosure provides a device including a combination of the period stretch device for executing an ultra-fast serial/parallel or parallel/serial conversion.

1. In the case of the reflexible target signal, the displacement reflection target signal is used. The basic principle of this method is based on the assumption that the speed rate of the surface of the reflective panel relative to the target signal is V1 in an initial condition. The reflective panel is moved along the direction of the signal propagation as velocity of V2 (V2≠0). Hence, compared with the fixed reflective panel, the later target signal takes longer time and more distance to reach the surface of the reflective panel, thus making the later target signal further away from the earlier target signal, so that the speed rate of the reflected signal received by observer/receiver is lower than that when the reflective panel is not moved (the action rate between the reflective panel and the target signal is also lower than that when the reflective panel is immobile). The above steps are used to expand the period of the signal. Compared with the fixed reflective panel, when the reflective panel is moved in the opposite direction of the signal propagation as the velocity of V2 (V2≠0), the later target signal takes shorter time and less distance to reach the surface of the reflective panel, thus making the later target signal closer to the earlier target signal, so that the speed rate of the reflected signal received by the signal observer/receiver is larger than that when the reflective panel is not moved (the action rate between the reflective panel and the target signal is also larger than that when the reflective panel is immobile). The above steps are used to shrink the period of signal. That is, depending on the Doppler shift, the Doppler shift is performed for the target signal to make its shift value meet an expected value by specific means. This application is different from the existing method for acquiring the speed or the movement patterns of objects only according to the result of the Doppler shift (using the known emission spectrum and the obtained reflection spectrum to learn the movement characteristics of the objects). The present invention solves the content of the original target signal by using the movement speed and orientation of the reflective panel, and the received reflection spectrum as known parameters. The focus and purpose of this application is not only to solve the content of the original target signal, but also to obtain the actual results of the spectrum changes. In the way, the device which doesn't work in the spectrum of the target signal is able to observe, transmit, and parse the content of the original target signal; or the device intends to get the signal which spectrum is changed. In particular, when spectrum has a very large changes, it brings a great value of application in many aspects such as the mutual transform of the infrared and the red light, and the mutual transform of the infrared and the radio wave.

2. In the case of the target signal which can be transmitted by the medium, in the present invention, the propagation speed of the target signal is changed by means of changing the characteristics of the medium during the propagation of the target signal in the medium, and thus the speed of the target signal when leaving from the medium is different from that when entering to the medium, and the time of the process for leaving the target signal from the medium is different from the time of the process for making the target signal enter to the medium, in order to complete the period stretch of the target signal.

Assuming that the period of the signal outside the media is T and the propagation speed of the signals is $v_e$, the wavelength of the signal outside the medium is:

$$\lambda_e = v_e \times T.$$

Assuming that the propagation speed of the signal in the media is $v_m$, the wavelength $\lambda_m$ of the signal when entering to the medium is:

$$\lambda_m = \frac{v_m}{v_e} \cdot v_e \times T,$$

and the wavelength $\lambda'_e$ of the signal when leaving from the medium is:

$$\lambda'_e = \frac{v_m}{v_e} \cdot v_e \times T \cdot \frac{v_e}{v_m} = v_e \times T, \quad \therefore \lambda'_e = \lambda_e.$$

That is, the wavelength of the original signal is unchanged when the original signal passes through the medium. However, if the medium for transmitting the signal is controlled, the speed of signal transmission is changed according to the values of the amplitude/flux/flow of the control signal. When the propagation speed of the signal in the controlled medium suddenly becomes $v_m'$ ($v_m \neq v_m'$), the wavelength of the signal when leaving the medium is:

$$\lambda'_e = \frac{v_m}{v_e} \cdot v_e \times T \cdot \frac{v_e}{v_m'} = v_e \times T \cdot \frac{v_m}{v_m'}.$$

That is, the signal period has changed when the signal returns to the original environment ($\because v_m \neq v_m' \therefore v_m \div v_m' \neq 1$).

During the signal entering to or leaving from the medium, if the feature of the propagation velocity of the controlled medium is continuously changed, the changing period stretch ratio can be obtained. In practical applications, for many mediums, when the target signal is transmitted in the medium, the distribution density and structure of the electron cloud will be changed due to some factors, such as the control signal, environmental noise. Thus, in for the sake of a fixed period stretch ratio, the control signal should be changed when entering to or leaving from the medium to correct the nonlinear effects due to the described factors.

3. In the case of the target signal which can be accelerated by the accelerating field, the target signals that pass through the accelerating field have different transit speeds by strengthening or weakening an acceleration field control signal gradually. According to the gradually strengthened control signal, a latter target signal can have a faster transit speed than the previous target signal, so the latter signal can catch up the former signal (this is to shrink a signal period); while according to the gradually weakened control signal, the latter target signal can have a slower transit speed than the previous target signal, so the latter signal is further behind the former signal (this is to expand a signal period), thus achieving the purpose of expanding and shrinking the target signal period. Key components of a device for signal period stretch include: an accelerator for applying an acting force on the target signal, a flow control signal generator and an accelerating signal generator, where the accelerator includes a target signal guided-in hole, a flow control pole, an acceleration pole, a guided-out hole or a flow detector/receiver, a target signal flow detection and correction unit and a base body for supporting/fixing the foregoing components. The base body is used as a reference origin to measure the displacements of the other parts. The flow control pole connects to the output of the flow control signal generator, and the acceleration pole connects to the output of the acceleration signal generator. The target signal flows through the accelerator in the following orders: entering into the signal guided-in hole; passing through the flow control pole, where the flow rate of the target signal is proportional to the amplitude of the control signal and the flow rate of the original target signal; retaining the flow rate of the target signal and entering the retained target signal into an accelerating field; and outputting the accelerated target signal through the signal guided-out hole or receiving the accelerated target signal by the detector/receiver, where the acting force applied on the target signal by the accelerating field is proportional to the amplitude of an acceleration signal.

When the target signals enter to the signal guided-in hole in a certain initial speed, the flow control signal generated by the flow control signal generator is used to proportionally retain the flows of the target signals that have imported to the accelerating field. In this case, if the intensity of the acceleration control signal is strengthened gradually, the latter target signal has faster transit speed than the previous target signal, so that the latter signal can catch up the previous signal, thus shrinking the signal period; if the intensity of the accelerating control signal is weakened gradually, the latter target signal has slower transit speed than the previous target signal, so the latter signal is slower than the previous signal, thus expanding the signal period.

In the present invention, the different parts of the target signal have been accelerated (or decelerated) in different degrees, but a reverse accelerator for secondary velocity collimation is not used, which is based on the situation that the flow reflects the value of the signal in the present invention, The reduced (or enlarged) space distribution density of the target signal caused by the linear acceleration (or deceleration) is just complemented and counteracted with the increased (or decreased) speed. Therefore, it does not cause non-linear change of flow (meet the conservation of the total substance), and the production difficulty in the hardware and manufacturing cost are reduced.

4. Although the foregoing three technical solutions have the period stretch capacity of the adaptable signal, when the signal period is very long or the arrival time of the signal is uncertain, one solution can't resolve all the technical problems or has a low practicality, thus limiting its application scopes. For example, (1) in the displacement reflection method, assuming that the vector change of the displacement reflector in the direction of signal propagation is −1000 m/s, and an optical signal with the period of 1 second (sec) is shrunk by the displacement reflector, then the displacement distance of the reflector is at least not less than −1000 m/sec×1 sec=−1000 m, which is difficult to achieve according a solution of one embodiment. Even if it can be achieved, it does not have practical value. In addition, it is considered that the uncertainty of the signal arrival time. Even if the reflector can move 1000 m and the signal is just arrived, the reflector has to keep on moving along this propagation direction. However, in fact, the arrival time of the signal can not be determined, and thus it will require that the reflector moves in this direction continually, which is unpractical. In addition, in the case of the limited distance between the signal source and the observer/receiver, they can not move towards each other when they meet. (2) in the medium controlled method, in the case that the maximum speed of the controlled medium is $10^7$ m/sec, the minimum speed of the controlled medium is $10^6$ m/sec, and the signal with period of 1 ms needs to be expanded 10 times, when the controlled response time of the medium is 0, the thickness of the medium is not less than $10^6$ m/sec×$10^{-3}$ sec=1000 m, which is also difficult to achieve or has little practical significance. (3) in the speed difference method, although the outer dimensions no longer be fully constrained, based on the quantum principles or the mutually exclusive force (e.g., electron flow) of the signal object themselves, the signal object can not be unlimitedly shrunk in the spatial scale, and the shrinkage of the signal object also depends on the changing range of acceleration signal in the accelerating field (the changing range is usually not very great). Therefore, for the signal whose life period is very long or arrival time is uncertain, the present invention relates to the method including: performing more than one embodiment cyclically at different time intervals of the serial signal to delay and synchronize (or serialized interleaving delay) the signals processed according to the method of multiple signal period stretch embodiments, and then outputting the synchronized signals in parallel (or serially), that is, the ultra-fast serial-to-parallel/parallel-to-serial conversion method of this present invention.

The method for ultra-fast serial-to-parallel conversion specifically includes the following steps of: dividing a target signal into same multi-channel target signals by means of a transmission diffusion or a reflection diffusion; delaying each of the divided target signals or a control signal of a signal period stretch device on each channel, so as to make the work time interval of the input forward work of the device on each channel adjacent each other, or $t_p$ make the work time interval overlap and cyclically adjacent; performing an uninterrupted expand by multiple device for signal period stretch one-one corresponding to the divided target signals; and converting the serial input target signal into a segmented parallel output signals and outputting the converted target signals along each channel.

The method for ultra-fast parallel-to-serial conversion specifically includes the following steps of: performing a period shrinkage for a target signal inputted in parallel by using a plurality of signal period stretch devices corresponding to a plurality of channels; delaying the target signal on each channel, or delaying the control signal of the signal period stretch device on each channel before the target signal is shrunk (if the target signals are the parallel input analog signals, the target signals need to be delayed, and the delay time of the target signals is the same as that of the control signal on the same channel) to make the shrunk target signal to be pairwise adjacent in time and space; and collecting the target signals on each channels into a transmission channel by means of transmission focusing or reflection focusing and path collimation, and outputting the collected target signals.

Based on the above technical principles of this invention, the present invention employs the technical implementation solutions as following.

1. in the case of the period stretch device for displacement reflection signal, the key component thereof includes a base body which is a reference origin to measure the displacements of other components, including a resonant cavity, two reflective panels, two transducers (which are not necessary when the control signals are the signals that push the reflective panels to directly produce a displacement), two control signal connectors, where two holes, i.e., a target signal guided-in hole and a target signal guided-out hole is provided on the base body. The left control signal connector, the left transducer, the left reflective panel, the middle resonant space, the right reflective panel, the right transducer and the right control signal connector are arranged in the resonant cavity from left to right. In addition, during operating, the device also needs a control signal generator and several cables connected to the control signal generator, and the control signal generator is connected to the control signal connectors of the base body via the cables of the control signal. When the target signals will reach the surface of the reflective panel, the control signal generator can output a control signal to control the reflective panels to produce a preset displacement. When the period of the target signal is expanded, the control signal is outputted to control the reflective panels to produce a forward (i.e., the direction is the same as the propagation direction of the target signal) displacement. When the period of the target signal is shrunk, the control signal is outputted to control the reflective panels to produce a backward (i.e., the direction is opposite to the propagation direction of the target signal) displacement. The gradient of the strong-weak change of the control signal is determined because the change of the vector per unit time is proportional to the ration of the stretched period of the target signal. In order to simplify the analysis and recovery work of the follow-up signal spectrum, the final purposes of the signal generator and the transducers should exactly produce a uniform motion state of the reflective panels in the stretched period of the target signal.

In order to process the target signals, the orientation of the base body is adjusted in advance, so that the target signal can reach the surface of the reflective panel, and a vector change can be produced in the propagation direction of target signal when the reflective panel has a relative displacement. When the target signal will reach the surface of the reflective panel, the control signal generator generates a corresponding control signal, and the transducer convert the control signal into the displacement of the reflective panel. Based on the displacement of the reflective panels producing vector changes in the propagation direction of the target signal, when the target signal is reflected by the reflective panels, the period of the target signal is stretched.

The method for stretching a period of the target signals sending from the target signal source at least includes steps as follows:

(1) importing the target signals into a resonant cavity through a target signal guided-in hole;

(2) changing the period of the target signal in the resonant cavity by using the displacement reflection of the two reflective panels for the target signal; and (3) after multiple displacement reflections, obtaining the target signal with a stretched period and outputting the stretched target signal through a target signal guided-out hole.

It should be noted that the period stretch device in the present invention is not required to include a control signal generator, and when the period stretch device does not contain the control signal generator, it should be connected to an external control signal generator.

2. In the case of the period stretch device for a controlled medium, the key component thereof includes a base body II. The base body II includes two reflective panels; a resonant cavity; a medium in the resonant cavity, in which the speed of the target signals is proportional or inversely proportional to the value of the amplitude/flux/flow of the external control signal, and where the left and right end surfaces of the controlled medium are capable of transmitting the target signal; two transducers provided on the upper and the lower end surfaces of the controlled medium and adapted to convert the control signal from the control signal generator into corresponding physical quantities to control the medium according to the value of the amplitude/flux/flow of the control signal; and two control signal connectors. The base body II provides a signal guided-in hole II and a signal guided-out hole II. In addition, when operating, the device also needs a control signal generator II and two control signal cables, and the control signal cables is used to output the control signal to the connectors of the transducer. When the target signal has been imported to and is not leaved the controlled medium, a signal strength is outputted to produce a predetermined change for the nature of the medium, so that the target signal obtains a different speed in the medium from the previous propagation speed. When the period of the target signal is expanded, the control signal slows down the propagation speed of the target signal in the medium; when the period of the target signal is shrunk, the control signal speeds up the propagation speed of the target signal in the medium. The strong or weak change amplitude of the control signal is dependent on a ratio of the speed ratio of the target signal entering the medium and leaving the medium which is proportional to the preset period of target signal expansion/shrinkage.

The method for stretching a period of the target signal from the target signal source II at least includes the following steps:

(1) importing the target signals to the resonant cavity through the target signal guided-in hole;

(2) changing the nature of the controlled medium timely to expand or shrink the target signal when the target signal each time passes through the medium, so as to change the period of the target signal; and (3) outputting the expanded or shrunk target signal from the target signal guided-out hole, after the period of target signal has been many times expanded or shrunk.

The incident and emergence surfaces of the controlled medium are parallel to the reflecting surfaces of the two reflective panels, and the distance from the controlled medium to the two reflective panels are respective L1 and L2, where $$L_1 = L_2 \geq \tfrac{1}{2}\int_0^{t_m} v_e dt,$$

where $v_e$ is the speed of the target signal outside the controlled medium, $t_m$ is the time that the target signal passes through the controlled medium (the longest period of the target signal is not greater than $t_m$, and the fundamental wave period of the control signal is equal to the total time that the target signal leaves the controlled medium, is reflected to the medium, and again passes through the controlled medium).

It should be specifically noted, when the medium is a control signal, or the medium can directly respond to the control signal, the transducers are not required. In this case, the control signal from the control signal generator is outputted to the medium through the connectors. For the electrical signal, the connectors is a connecting line or pad for transmitting the control signal outputted from the control signal generator to the interior or surface of the controlled medium. The connector is connected by the processing through which the controlled medium can respond to the control signal. For a field signal, the connectors can transmit the control signal to the vicinity of the medium to receive the control signal by the medium, and thus the connector need not to contact with the medium actually. The period stretch device of the controlled medium is not required to include the control signal generator II. When the control signal generator II is not included, an external control signal generator II should be connected during the operation of the device.

3. The electron-gun type period stretch device include a high voltage supply and sawtooth wave signal generator (equivalent to an acceleration signal generator), an electric current measuring and correcting and synchronizing circuit (equivalent to a flow control signal generator and a target signal flow detecting and correcting unit), and an electronic vacuum tube (equivalent to an accelerator). One terminal of the target signal source III is connected to the common ground, the other terminal is connected to the cathode (equivalent to the target signal guided-in hole) of the electronic vacuum tube. One terminal of the high voltage supply and sawtooth wave signal generator is connected to the common ground. In addition, the high voltage supply and sawtooth wave signal generator outputs an acceleration signal G2 to the accelerating pole of the electronic vacuum tube and outputs a high voltage signal HV to the high voltage anode of the electronic vacuum tube. A synchronization signal wire of the high voltage supply and sawtooth wave signal generator is electrically connected to the electric current measuring and correcting and synchronizing circuit. One terminal of the electric current measuring and correcting and synchronizing circuit is connected to the common ground, and an outputs flow control signal G1 is connected to the gate (equivalent to a flow control pole) of the electronic vacuum tube. A signal connection cable of the electric current measuring and correcting and synchronizing circuit is connected to the target pole (equivalent to a flow detector/receiver) of the electronic vacuum tube. The target pole of the electronic vacuum tube is adapted to receive the electronic from the cathode of the vacuum tube. The electric current measuring and correcting and synchronizing circuit further includes two signal wires, i.e., a synchronization signal wire and a signal output cable for transmitting the stretched target signal.

This method includes the following steps.

(1) The target signal generated by the target signal source III is transmitted to the cathode of the electronic vacuum tube through the signal connection wire to form an electron beam flow from the cathode to the target pole of the electronic vacuum tube under the control of attractive force of the high voltage anode of the electronic vacuum tube. The value of the electron beam flow that is affected by the cathode-gate biasing voltage is proportional to the original strength of the target signal and the voltage of the cathode-gate of the electronic vacuum tube.

(2) After the cathode emits the electronic beam flow including the target signal, the voltage of the acceleration pole is increased or decreased gradually, so that the electrons that import the accelerating field at different time obtain different transit speeds.

(3) When reaching anode, the electron beam flow obtain a momentum enough to pass through the center hole of the anode to arrive at the target pole of the electronic vacuum tube.

(4) the signal in the electron beam flow have been stretched when the electron beam reaches the target pole, the stretched signal is detected and corrected by the electric current measuring and correcting and synchronizing circuit, and then the detected and corrected signal is outputted through the target signal output cable.

The device for ultra-fast serial-to-parallel/parallel-to-serial conversion includes a number of validity selectors (the selectors is not the necessary components of the device for ultra-fast serial-to-parallel/parallel-to-serial conversion, but can be implemented by the follow-up circuits), a number of aforementioned signal period stretch devices, a number of signal delayers (if the external control signal generator directly delays each control signal to make the beginning and ending work time of each signal period stretch device different, the signal delayers can be omitted), a target signal serial-to-parallel/parallel-to-serial conversion device (such as, the target signal focus/diffusion and collimating lens), and an external control signal generator. In addition, the validity selector, the signal period stretch device and the signal delayer are connected in series, and then connected in parallel with the devices which includes the validity selector, the signal period stretch device and the signal delayer and are also connected in series, and then the parallel connection of the validity selector, the signal period stretch device and the signal delayer is connected to the target signal serial-to-parallel/parallel-to-serial conversion device. The external control signal generator is connected to the validity selectors and the signal period stretch devices.

Beneficial Effect and Application Field

According to the present disclosure, the relative action rate between the target signal and the observer/receiver is changed. For the observer/receiver, the target signal with the expanded or shrunk period is completely consistent with the signal which is directly outputted from the signal source and has the same rate and life period. The observer/receiver can not determine whether the obtained signal is the stretched signal or the signal with a certain spectrum/period from the signal source.

All solutions of the present disclosure can easily realize an inverse transformation by changing the timing of the control signal or the change relationship of the slope. In addition, the analog technology is applied for all solutions to perform the lossless signal details. The stretch processing function can also be used to the time interval of the discontinuous signal. The first and second solutions can also effectively solve the problem of the response time (which only depends on the characteristics of material at molecular level, atomic level, or elementary particle level), thus completely solving the matching and constraint problems between the front-end signal and the response time of back-end devices. The method for stretching the period of the original signal can also be used for the occasion that the spectrum produces nature changes (for example, the microwave is shrunk into infrared, and the purple is shrunk into UV, or their inverse transformations).

The ultra-fast serial-to-parallel conversion technology of this disclosure make the change rate of the signal outputted in parallel reach the hump speed of the existing optoelectronic device, and can shrink the signal with the hump speed of the optoelectronic devices to generate a signal with higher density. Based on the features of the invention, chronometry can be applied to improve the temporal resolution of the measurement devices, to implement an ultra-fast measurement and analysis and to produce a spectrum shift lens or spectrum shift lenses, such as infrared visual glasses and red shift/blue shift lens, and a precision measurement systems based on the applications of signal detail features. The present disclosure can greatly improve the bandwidth of the existing communication system and can be applied to high-speed signal sampling technique (such as a probe of a sampling oscilloscope) and high-speed photography, which can provide a feasible technological approach for capturing the dynamic motion characteristics of the ultra-fast electrons, protons or other microparticles. The present disclosure is also applied to the occasions that the response time of the optoelectronic device is less than the change rate of the target signal.

BRIEF DESCRIPTION OF THE DRAWINGS

In FIG. 1: 1—control signal generator; 2—target signal source; 3—target signal guided—in hole; 4—left reflective panel; 5—left control signal cable; 6—left transducer; 7—left control signal connector; 8—target signal guided—out hole; 9—right control signal connector; 10—right transducer; 11—right reflective panel; 12—right control signal cable; 13—base body; 14—resonant cavity.

In FIG. 2: 21—control signal generator II; 22—target signal source II; 23—target signal guided—in hole II; 24—left reflective panel II; 25—upper control signal cable; 26—upper transducer; 27—upper control signal connector;

28—target signal guided—out hole II; 29—lower control signal connector; 30—lower transducer; 31—right reflective panel II; 32—lower control signal cable; 33—base body II; 34—controlled medium.

Figure 3:
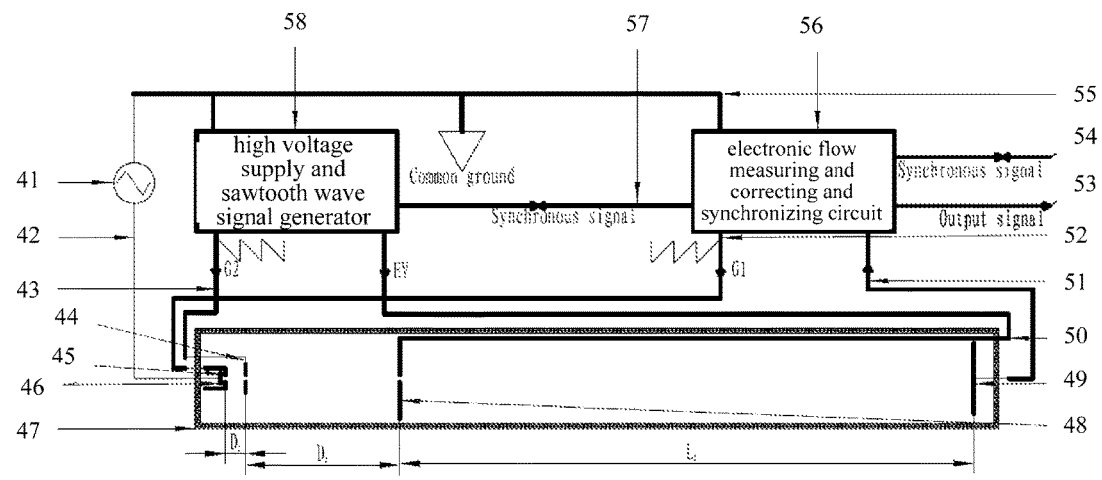
FIG. 3 illustrates one embodiment of an electron gun.
Figure 4:
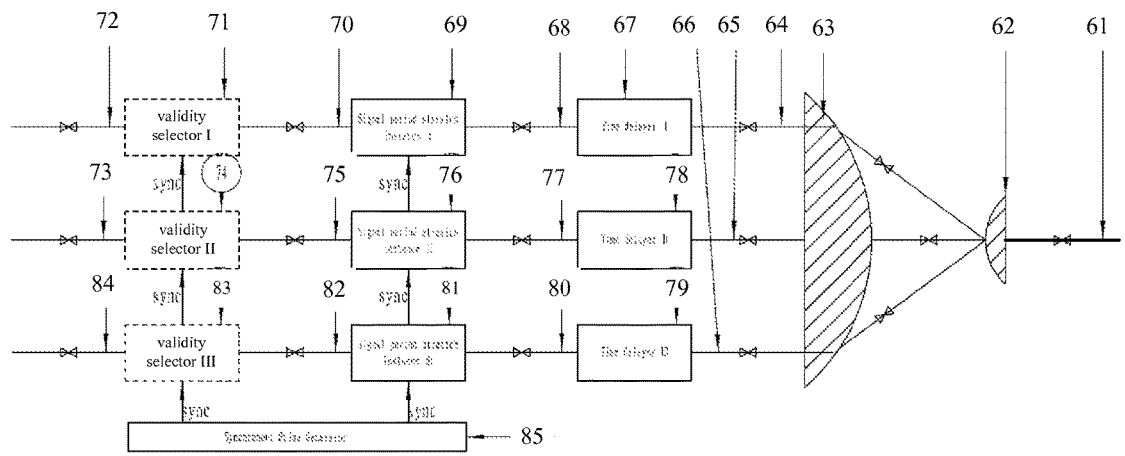
FIG. 4 illustrates one embodiment of an ulart-fast serial-to-parallel/parallel-to-serial conversion.

In FIG. 3: 41—target signal source III; 42—target signal cable; 43—acceleration signal cable; 44—accelerating pole of electronic vacuum tube; 45—gate of electronic vacuum tube; 46—cathode of the electronic vacuum tube; 47—electronic vacuum tube; 48—high voltage anode; 49—target pole for electronic absorption; 50—high voltage anode cable; 51—signal wire for target pole current output; 52—control signal cable of gate; 53—target signal output wire; 54—synchronization signal wire; 55—common ground; 56—electronic flow measuring and correcting and synchronizing circuit; 57—synchronization signal wire II; 58—high voltage supply and sawtooth wave signal generator;

In FIG. 4: 61—target signal output/input wire; 62, 63—target signal focusing/diffusion and collimating lens; 64—fourth signal moment of first channel; 65—fourth signal moment of second channel; 66—fourth signal moment of third channel; 67—delayer I; 68—third signal moment of first channel; 69—signal period stretch device I; 70—second signal moment of first channel; 71—validity selector; 72—first signal moment of first channel; 73—first signal moment of second channel; 74—validity selector II; 75—second signal moment of second channel; 76—signal period stretch device II; 77—third signal moment of second channel; 78—delayer II; 79—delay III; 80—third signal moment of third channel; 81—signal period stretch device III; 82—second signal moment of third channel; 83—validity selector III; 84—first signal moment of third channel; 85—synchronization signal controller.

DETAILED DESCRIPTION OF THE INVENTION

The technical solutions will be described hereinafter in conjunction with drawings.

Figure 1:
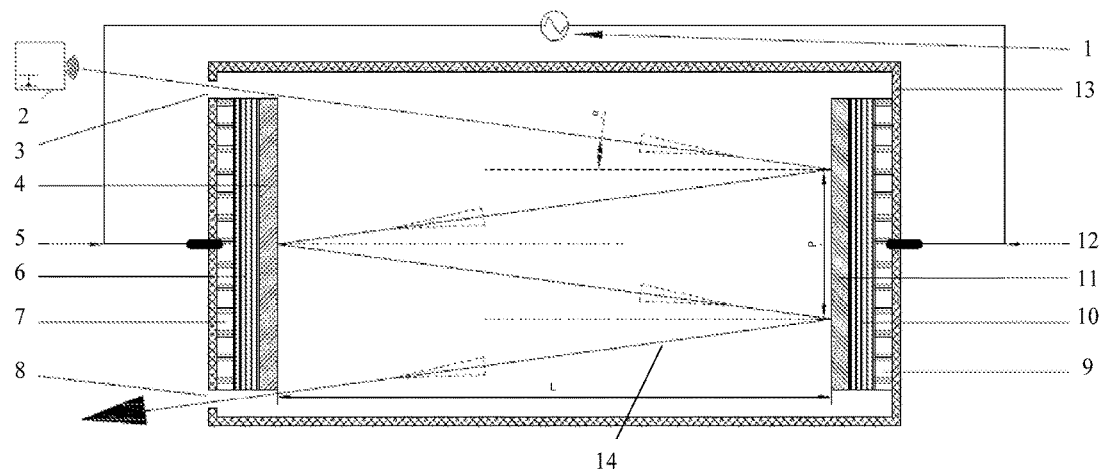
FIG. 1 illustrates one embodiment of a double-sided displacement reflection.

Referring to FIG. 1, a control signal generator 1 generates a movement control signal, so as to output a control signal which moves a left reflective panel 4 or right reflective panel 11 for a preset displacement when a target signal reaches the surface of the reflective panel. When the period of the target signal needs to be expanded, the control signal generator 1 outputs a control signal which moves the left reflective panel 4 or the right reflective panel 11 for the displacement in the same propagation direction as the target signal. When the period of the target signal needs to be shrunk, the control signal generator 1 outputs the control signal which moves the left reflective panel 4 or the right reflective panel 11 for the displacement in the opposite propagation direction relative to the target signal. The strong-weak change gradient of the control signal outputted from the control signal generator 1 is dependent on the ratio of the change of the vector per unit time which is proportional to the expected expansion/shrinkage period of target signal. The generator 1, the left transducer 6 and the right transducer 10 cooperatively move the left reflective panel 4 or the right reflective panel 11 uniformly during stretching the signal period, so that the target signal has a smaller non-linear spectrum the transfer. There is no necessary that the signal of the left control signal cable 5 is completely symmetrical with the signal of the right control signal cable 12. However, the period of the fundamental wave of the control signal needs to be consistent with the time that the starting of the target signal reaches the opposite reflective panel, so as to perform the same operation on the target signal after some reflections (always shrink or always stretch). The left transducer 6 and the right transducer 10 are used to convert the control signal from the generator 1 to the actual physical movement of the left reflective panel 4 or the right reflective panel 11, or the physical movement between the control signal and the reflective panel, such as the effect of the electric field signal on the plasma. Thus, the left transducer 6 and the right transducer 10 can push the left reflective panel 4 or the right reflective panel 11 to produce the displacement according to the control signal proportional to the displacement. The orientation of the reflective panel should meet that the angle between the incident wave and the normal of the reflective panel, i.e., angle of incidence $\alpha$, is the value of $0°<\alpha<90°$, so as to avoid that the signal backtracks or can not be repeatedly stretched or shrunk. If the signal needs to be reflected many times, the angle of incidence can not be too big. The translational direction of the reflected wave must be gradually close to the target signal guided-out hole 8, so that the repeatedly reflected target signal is gradually close to the target signal guided-out hole 8 and is completely guided out through the guided-out hole 8, avoiding signal being always reflected, absorbed or interfered inside the resonator.

Figure 5:
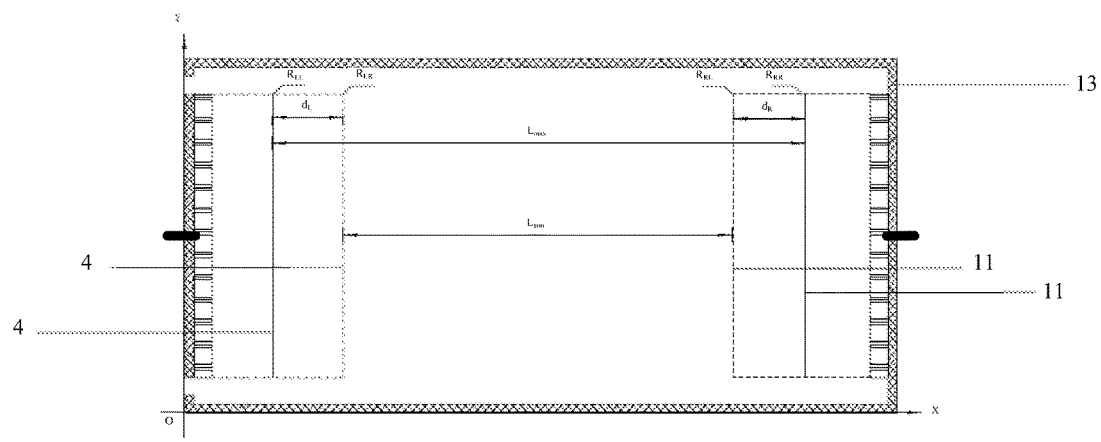
FIG. 5 illustrates base specification parameters of double-sided displacement reflection.
Figure 6:
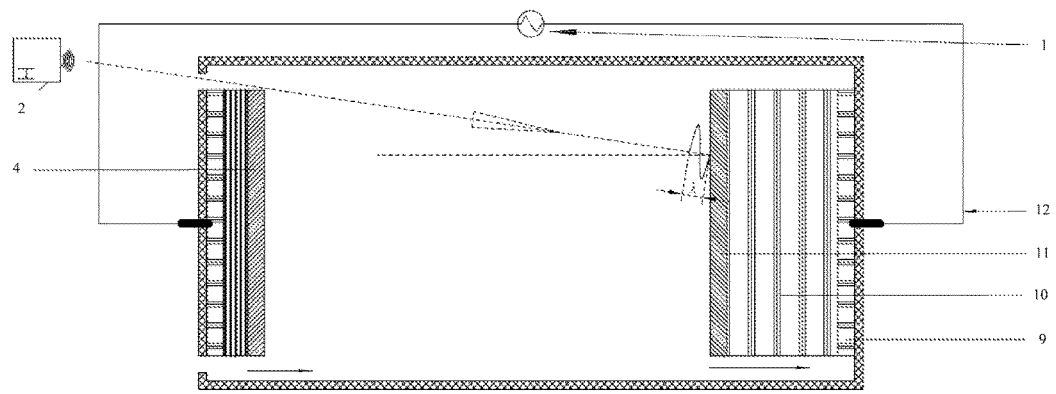
FIG. 6 illustrates a first work timing state of an embodiment of the double-sided displacement reflection.
Figure 7:
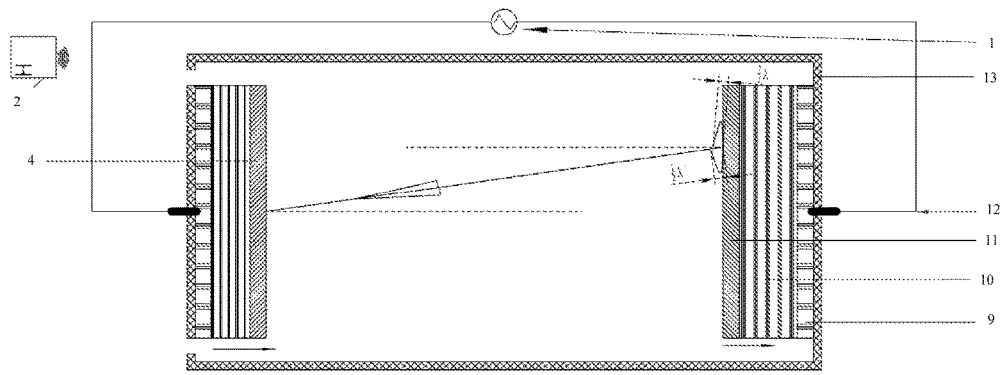
FIG. 7 illustrates a second work timing state of an embodiment of the double-sided displacement reflection.
Figure 8:
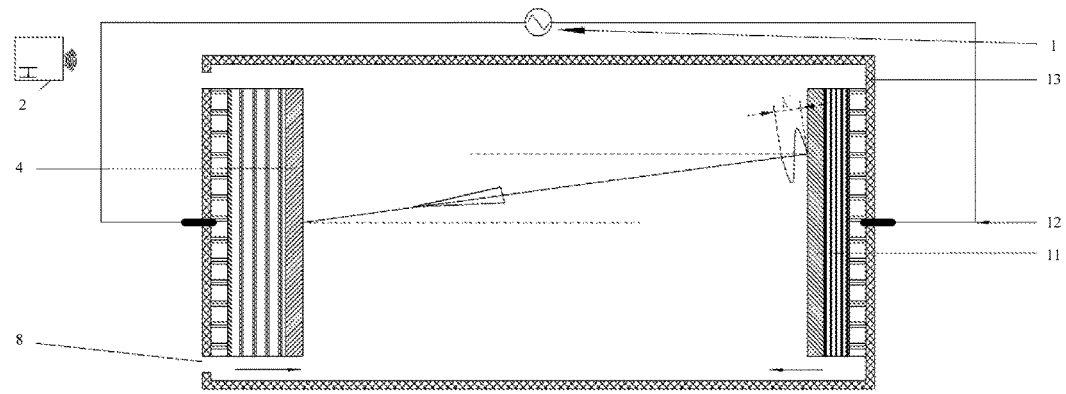
FIG. 8 illustrates a third work timing state of an embodiment of the double-sided displacement reflection.
Figure 9:
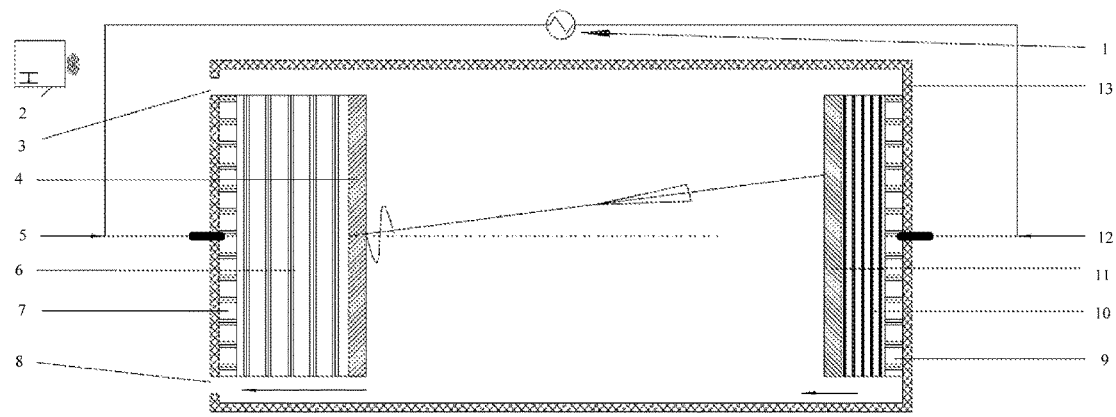
FIG. 9 illustrates a fourth work timing state of an embodiment of the double-sided displacement reflection.
Figure 10:
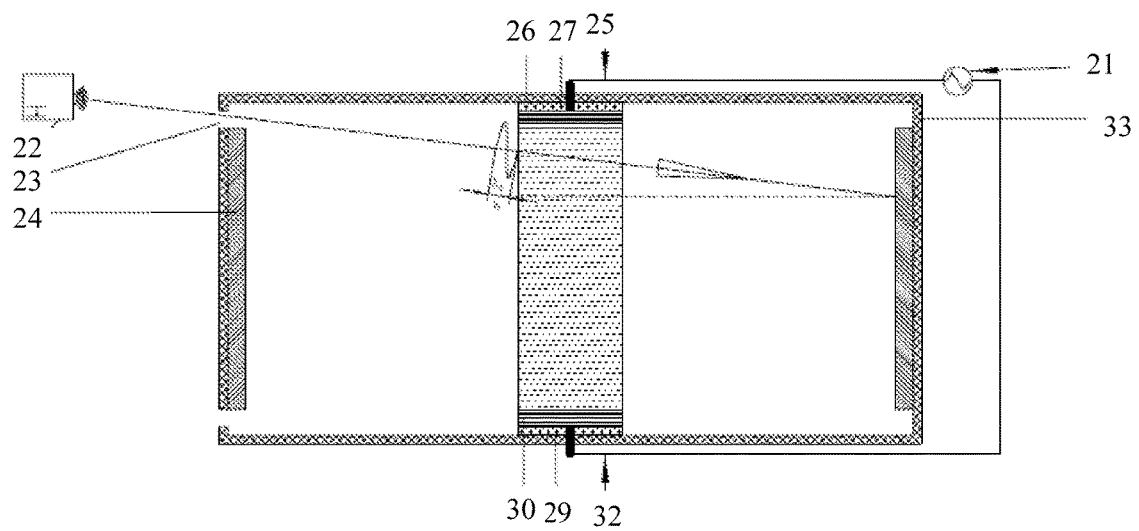
FIG. 10 illustrates a first work timing state of an embodiment of the controlled transmission medium.
Figure 11:
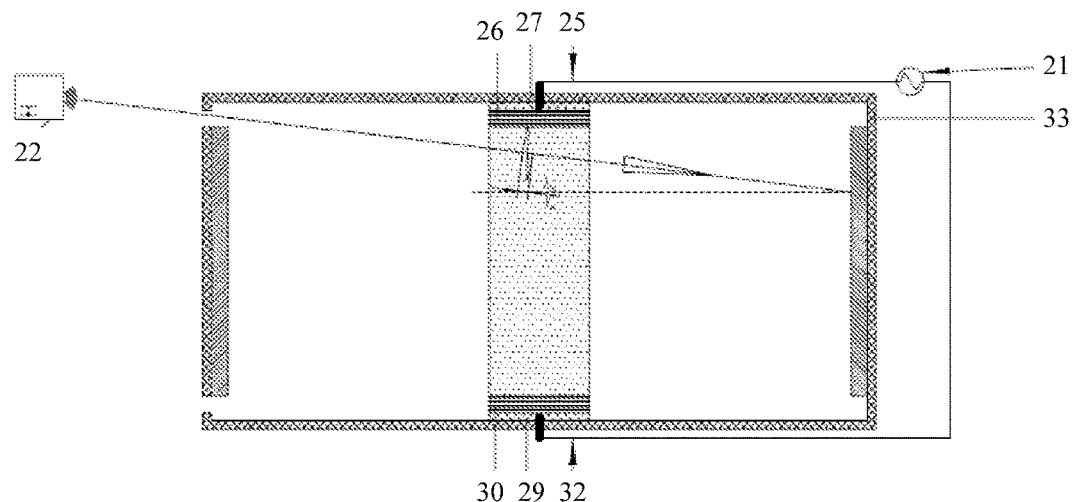
FIG. 11 illustrates a second work timing state of an embodiment of the controlled transmission medium.
Figure 12:
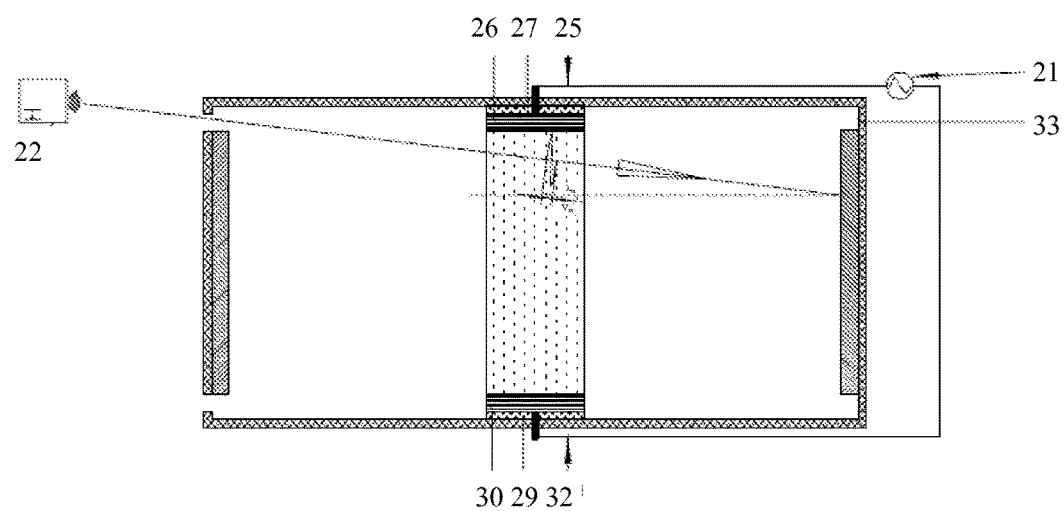
FIG. 12 illustrates a third work timing state of an embodiment of the controlled transmission medium.
Figure 13:
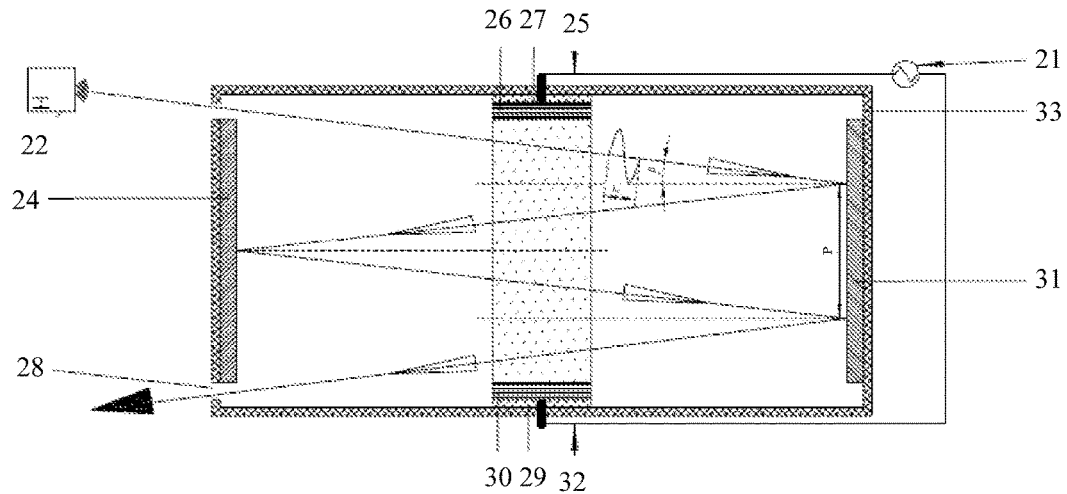
FIG. 13 illustrates a fourth work timing state of an embodiment of the controlled transmission medium.
Figure 14:
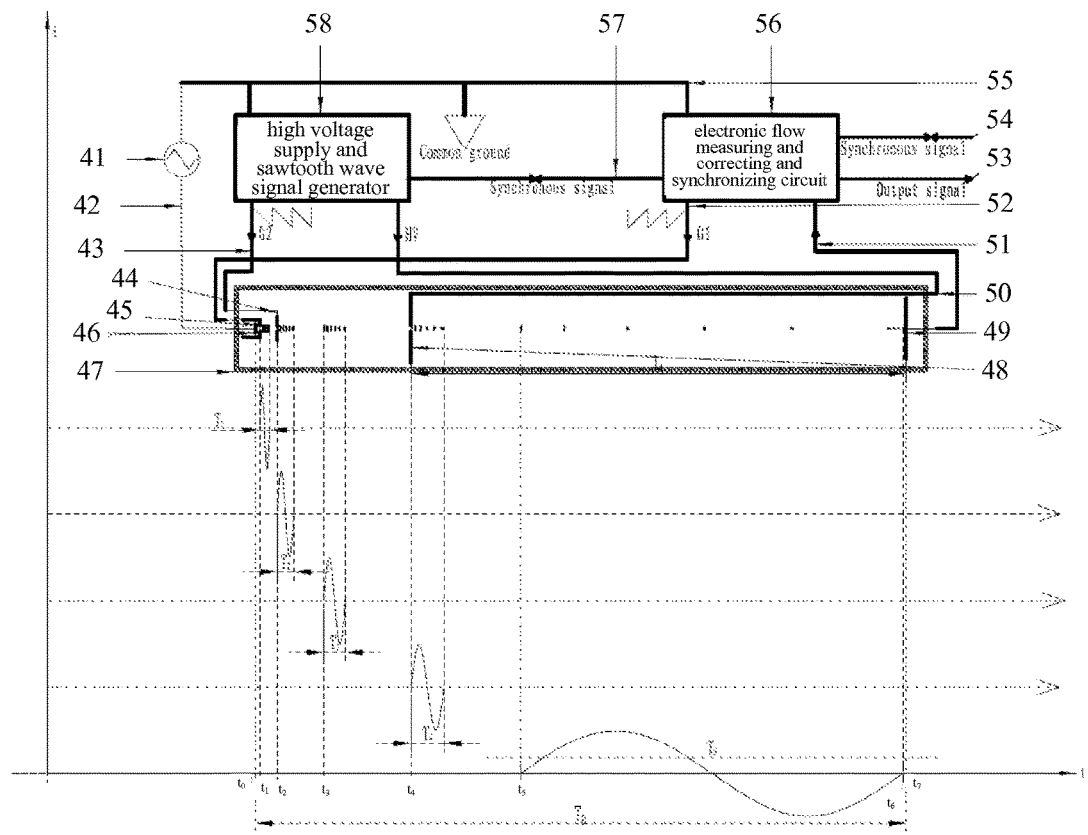
FIG. 14 illustrates a work timing state of an embodiment of the electron gun.
Figure 15:
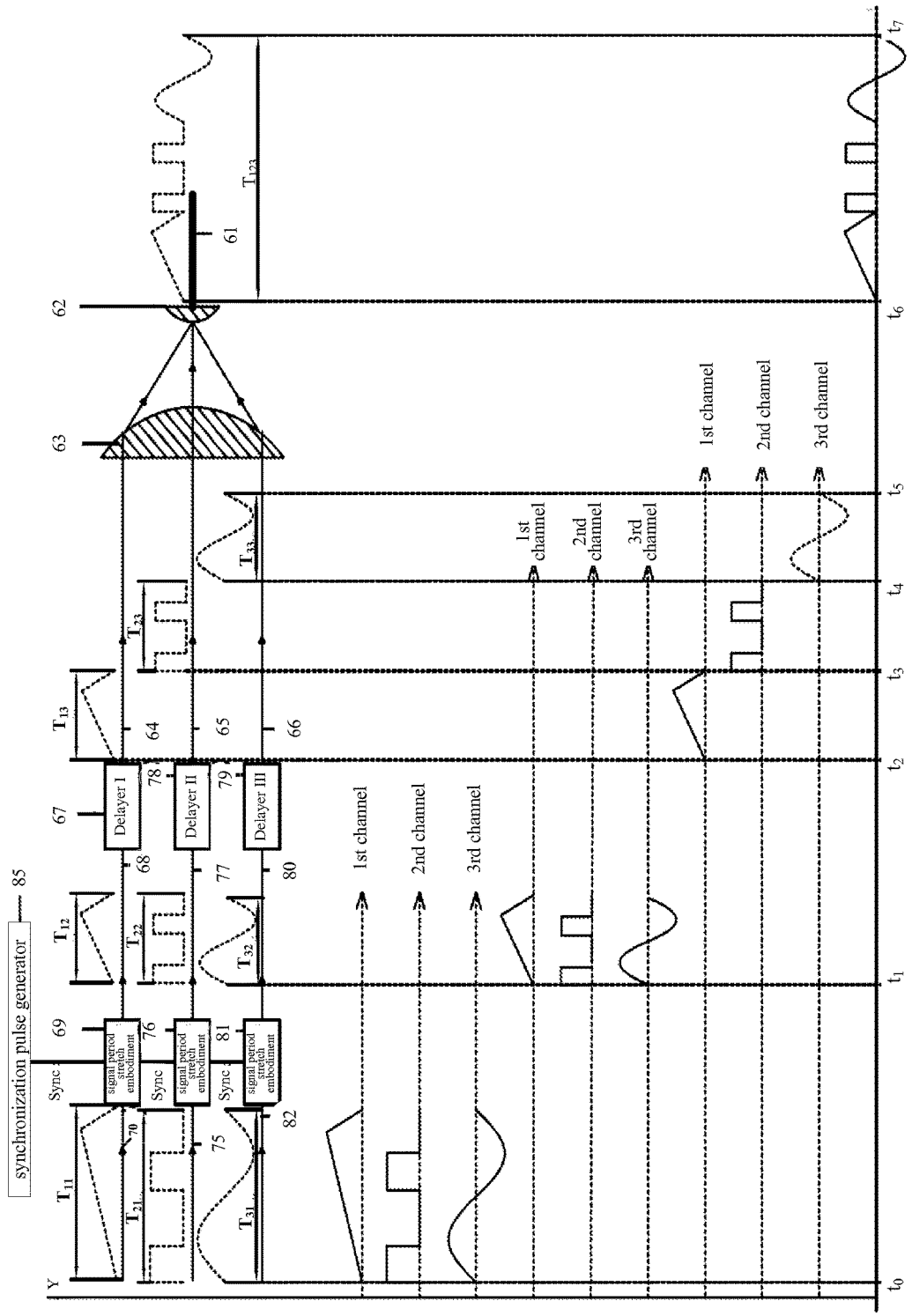
FIG. 15 illustrates a work timing state of an embodiment of the ultra-fast parallel-to-serial conversion.
Figure 16:
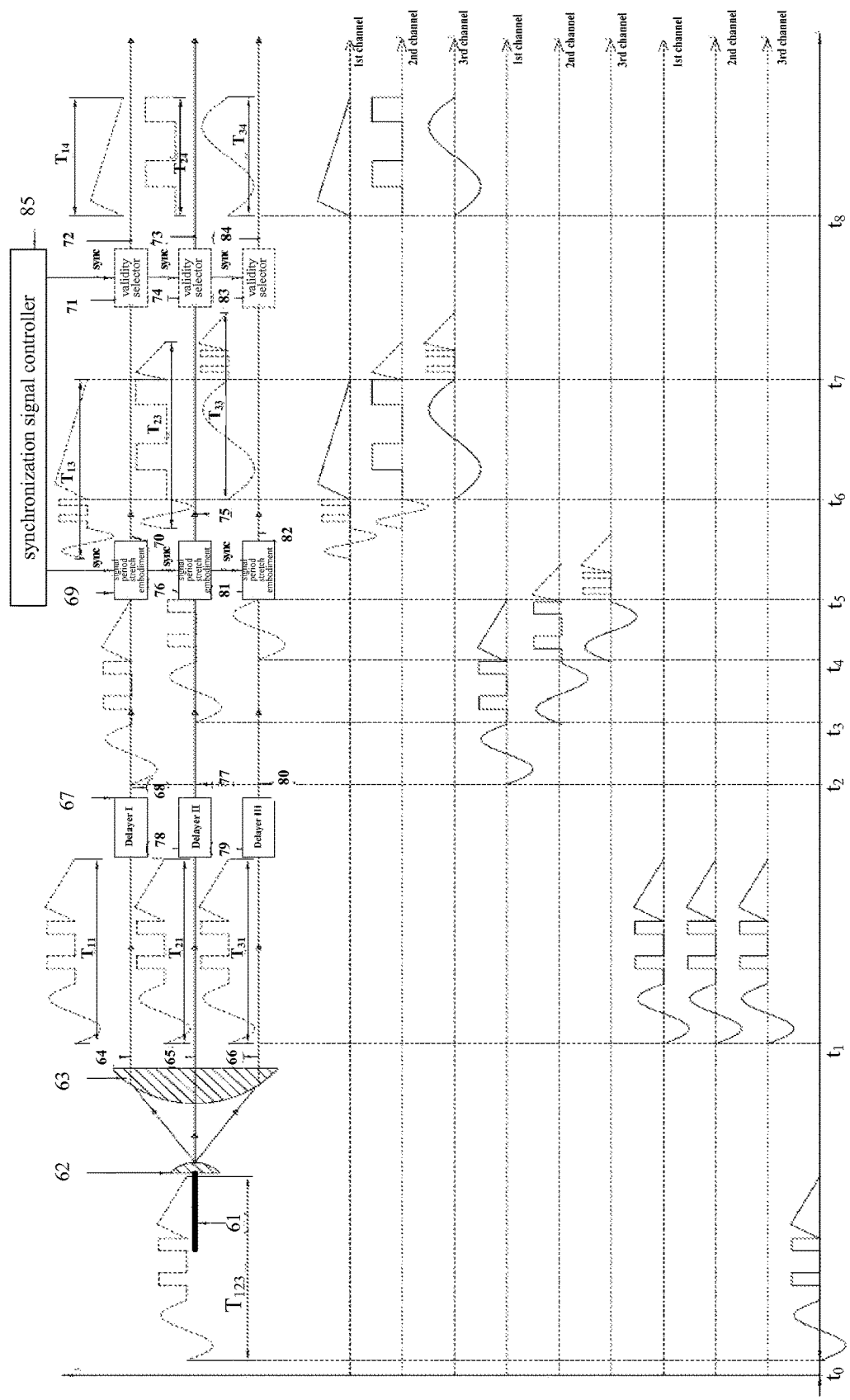
FIG. 16 illustrates a work timing state of an embodiment of the ultra-fast serial-to-parallel conversion.

Referring to FIG. 5, the parameters are determined in this embodiment according to the following steps (an expanded signal is taken here as an example).

The purpose of this embodiment is to proportionally expand or shrink the target signal period. The ratio (that is, the basic requirement of the application system to this embodiment) of the expansion or shrinkage of the target signal period is preset to a known quantity $K_N$, where N represents the reflection times of the target signal which is determined based on the movement velocity of the reflective panel and the expected magnification ratio. The velocity of the reflective panel depends on the mass of the reflective panel and the response time and power conversion capability F of the transducer. Assuming that the response time and power conversion capability are predetermined by the specific material and the transducer.

Assuming that the propagation speed of the target signal is a constant U, the left reflective panel 4 or the right reflective panel 11 takes radial symmetry reciprocating movement in the normal direction of the incident wave (the relationship between amplitude and time is, but not limited to, in the form of a triangular wave; the shorter the reverse time is, the longer the period that the device processes the target signal, but no more than the time spent by the target signal travelling through twice minimum distance between two reflective panels (during period of stretch signal)). The velocity of movement of the reflective panel 4 or 11 relative to the base body 13 is v. When the target signal is conduct into the guided-in hole 3 and will arrive at the right reflective panel 11, the right reflective panel 11 is located at $R_{RL}$, the starting of the signal with period T arrives at the surface of the reflective panel at time $t_1$. If the reflective panel does not move at $t_1$, the end of the signal spends a time T to arrive at the right reflective panel 11 at time $t_2$. In this case, the right reflective panel 11 moves in the direction of the signal propagation, so that the end of the signal actually reaches the right reflective panel 11 at time $t_3$ ($t_3>t_2$). When the starting of the signal reflected by the right reflective panel 11 will arrive at the left reflective panel 4, the left reflective panel 4 should be located at $R_{LR}$, so the time for transmitting the starting of the signal from the right reflective panel 11 to the left reflective panel 4 is $T_{U^{min}}$:

$$T_{Umin} = \frac{L_{min}}{U\cos(\alpha)}.$$

Based the realization principle, during expanding the signal period, after the signal arrives at the left reflective panel 4, the left reflective panel 4 should move toward the position of $R_{LL}$. Thus, the time for transmitting the end of the signal from the right reflective panel 11 to the left reflective panel 4 is T+2 ($t_3't_2$), and the time for reflecting the end of the signal from the left reflective panel 4 to the right reflective panel 11 is T+3 ($t_3-t_2$), until N times of reflections:

$$L_{max} = \int_0^{(T+N(t_3-t_2))} \cos(\alpha)U dt.$$

In this case, the target signal must be exported or the reflective panel must be stopped moving, otherwise, otherwise errors (boundary will be reverse processed) will occur due to the overlapping of the expansion/shrinkage state. That is, in the conditions of symmetrical reciprocating vibration, $L_{max}$ meets:

$$L_{max} \geq \int_0^{(T+N(t_3-t_2))} \cos(\alpha)U dt.$$

In the conditions of asymmetric reciprocating vibration, the relationship is changed according to the ratio that the forward work occupies the period of the control signal. Assuming that the duty cycle of the forward work is k, the $L_{max}$ meets:

$$L_{max} \geq \int_0^{(T+N(t_3-t_2))} \frac{1}{2k}\cos(\alpha)U dt.$$

In other words, the operating mode and the maximum period $T_{max}$ of the target signal (the period of the expanded signal is the maximum period length of output signal, and the period of the shrunk signal is the maximum period length of input signal) can be determined according to the distance between the vibrating panels. In addition of improving the duty cycle of the forward work, the method of reducing the speed of the target signal can stretch the signal with longer period by using the two vibrating panels. The medium with high refractive index can be generally used to achieve this purpose. In the case that every propagation path of the target signal has the same physical property, the relational expression is only adapted.

In FIG. 1, the signal period stretch ratio is:

$$k_N = \left(1 + \frac{v\cos(\alpha)}{U}\right)^N,$$

where $0<\alpha<90$.

We can decide the range of one parameter between the movement velocity of the reflective panel and the angle of incidence α according to the above relational expression when the other parameter is restricted. For example, when the movement velocity is greater restricted, we can preferably determine the range of the angle of incidence α. Since the change of the speed U of the target signal relates to the medium movement, the speed U of the target signal can not be changed preferably, unless the change of the speed U will not affect the transducer and the vibration performance of the reflective panel and not interfere on the target signal. The reflection times N can also be determined by the incident angle α and the translation distance (H) between the reflective panel guided-in and the guided-out hole:

$$N = \frac{H}{UT_{max}\sin(\alpha)},$$

Where $T_{max}$ is the maximum period of the target signal (the period of the expanded signal is an output period, and the period of the shrunk signal is an input period), so that the position of the guided-out hole relative to the guided-in hole and reflection times should be determined when the incident angle is adjusted:

$$k_N = \left(1 + \frac{v\cos(\alpha)}{U}\right)^{\frac{H}{UT_{max}\sin(\alpha)}}.$$

When the incident angle, the maximum period of the target signal and the movement velocity of the reflective panel have been determined, the period length of the target signal to be processed can also decide the distance from the left reflective panel 4 to the right reflective panel 11, where the minimum distance from the left reflective panel 4 to the right reflective panel 11 is:

$$L_{min} \leq \int_0^T \cos(\alpha)U dt,$$

and the maximum distance is:

$$L_{max} \geq \int_0^{K_N T} \cos(\alpha)U dt.$$

Generally, in the case of the expanded signal period, no matter whether the starting of the signal has a target signal, the starting of the signal will be served as a reference value of the initial phase in this embodiment, and the minimum distance from the left reflective panel 4 to the right reflective panel 11 and the fundamental wave period $T_c$ of the control signal:

$$T_c = \frac{d_L}{v} = \frac{d_R}{v} = T_{Umin} = \frac{L_{min}}{U\cos(\alpha)}$$

where $d_L$ represents the displacement value that the left reflective panel 4 is moved, and $d_R$ represents the displacement value that the right reflective panel 11 is moved.

The process for determining the above parameters is the typical algorithms and inference steps for determining stretch signal period. In the practical engineering application, it is not the only process to determine the above parameters. Only in the case of a fixed stretch ratio, the above process for determining the above parameters is used, which is limited to the materials or environment, and thus the restricted range of known quantity needs to be further detailed to determine the optimum range of the engineering parameter according to this embodiment. The process for determining the parameters of the shrunk signal period is the inverse transform of this embodiment, which is similar to the process of the above expanded signal period and will not repeated again.

Figure 2:
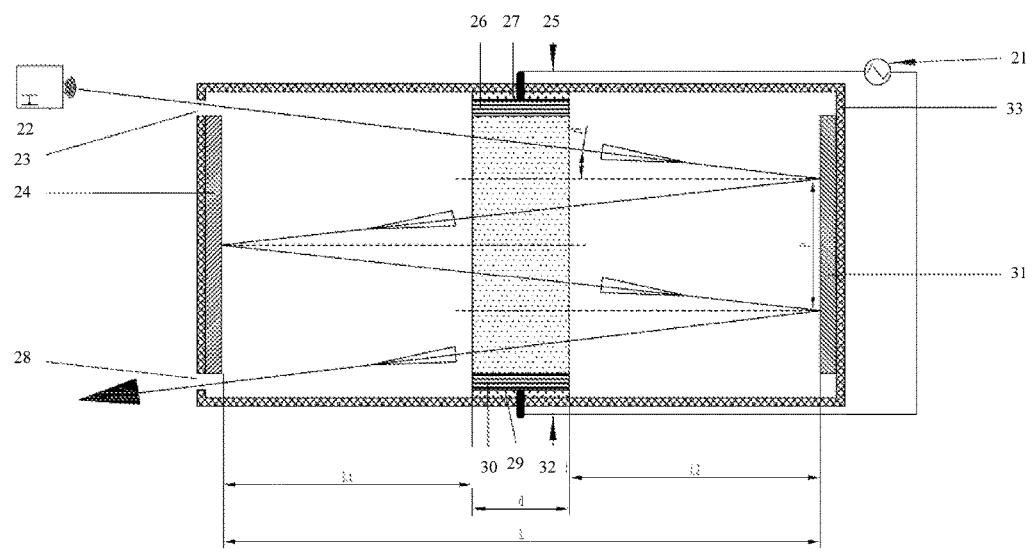
FIG. 2 illustrates one embodiment of a controlled transmission medium.

Referring to FIG. 2, the two transmission surface of the controlled medium 34 need to be parallel to the reflecting surfaces of the left reflective panel II 24 and the right reflective panel II 31, and the distance (L1, L2, and L1=L2) should be greater than a half of the product of the propagation time of the target signal outside the controlled medium 34 and the propagation speed of the target signal in the controlled medium 34 (in the case that the physical properties of the path that the target signal has passed before the reflective panel is the same as the path that the target signal has passed after the reflective panel, the product of the path that the target signal has passed before the reflective panel and the path that the target signal has passed after the reflective panel, otherwise it should be the product of the full path). Assuming that the propagation speed of the signal outside the controlled medium is $v_e$, and the time of that the target signal passed through the medium is $t_m$, then:

$$L_1 \geq \frac{1}{2}\int_0^{t_m} v_e dt, L_2 \geq \frac{1}{2}\int_0^{t_m} v_e dt.$$

The wavelength of the signal outside the controlled medium is set as $\lambda_e$, the propagation speed of the signal in the medium is $v_m$, the wavelength of the signal is $\lambda_m$, the thickness of the controlled medium is d, and the distance of the two reflective surfaces is L, then the period of the fundamental wave of the control signal is $t_m+(L-d)/v_e$ in the embodiment. Thus, after several times reflections, the target signal is still performed the same operations (always shrink or always expand). Lower $v_m$ and $y_e$ is conducive to process the target signals with longer period. However, because the target signal is restricted to some factors, such as the density of the retention signal in the controlled medium, the medium density, the electron cloud distribution of the controlled medium, the propagation speed $v_m$ in the controlled medium can not be too low, and the thickness d of the controlled medium and the gaps (L1 and L2) need to be increased accordingly.

When the target signal source 22 transmits a target signal, the target signal with the wavelength of $\lambda_e$ and the propagation speed of $v_e$ passes through the target signal guided-in hole II 23 and reaches the left surface of the controlled medium 34 at time $t_0$. When the time of transmitting the signal by the target signal source 22 is knowable or controllable, the control signal generator II 21 generates the control signal with specified physical quantities (such as amplitude, flux, flow, etc.) and the specific strength. The actual value of the control signal is dependent on the conversion rate of the controlled medium 34 and the stretch range. The control signal is transmitted to the upper control signal connector 27 and the lower control signal connector 29 respectively through the upper control signal cable 25 and the lower control signal cable 32. The upper transducer 26 and the lower transducer 30 convert the energy form of the control signal to an energy form of the characteristic of the propagation speed of the controlled medium 34. When the end of the target signal completely enters into the medium at time $t_1$ (in this case, the propagation speed in the controlled medium 34 is $v_m$, and the wavelength is $\lambda_m$), the control signal generator II 21 generates another control signal whose strength is different from that of the pervious control signal. The speed $v_m'$ of second control signal keeps unchangeable when the target signal leaves the medium. In the process of stretching the signal period, $v_m' < v_m$. Thus, the time $t_{mo}$ that the target signal leaves the medium ($t_{mo}=\lambda_m/v_m'$) is greater than the time $t_m$, that the target signal enters into the medium ($t_{mi}=\lambda_e/v_e=\lambda_m/v_m$), and thus after the signal leaves the medium, the wavelength of the original signal is:

$$\lambda_e' = v_e \times T \cdot \frac{v_m}{v_m'}.$$

Thus, after multiple times passing through the controlled medium 34, the period stretch ratio of the target signal in the same control state is:

$$k_N = \left(\frac{v_m}{v_m'}\right)^N.$$

The reflective panel can be a piezoelectric ceramic with a sliver-plated side (used as reflection function). The controlled medium can be, but not limited to, the plasma or lithium niobate. The transducers can convert control electric signal to the displacement, or convert the control electric signal into an electromagnetic force or electrostatic force to influence the characteristics of the medium.

In order to further expand/shrink the period of the target signal, the signal period stretch device with the above controlled medium can be combined with the signal period stretch device based on displacement reflection. Specifically, the control signal generator 1 and the left and right control signal cable 5 and 12 for connecting the control signal are equipped on the signal period stretch device with the controlled medium, and the control signal generator 1 is electrically connected to the left control signal connector 7 via the left control signal cable 5, and connected to the right control signal connector 9 via the right control signal cable 12. The left and right transducers 6 and 10 are capable of proportionally converting the control signal from the left and right control signal connectors 7 and 9 into the signal for controlling the displacement of the reflective panel, where the conversion is proportional to the amplification/flux/flow.

It should be noted that, in the embodiment, the signal period stretch device is unnecessary to include the control signal generator I and the control signal generator II. During the operation, the stretch device without the control signal generators should connect an external control signal generator.

Referring to FIG. 3, this embodiment is a specific application of speed difference, which is based on the interaction of the electronic and electric field.

Assuming that the distance from the cathode to the target pole is L, and the voltage of the accelerating pole is gradually weakened, then the acceleration a of the electronic is changeable, a=qU/mD, where D is the distance from the accelerating pole to the cathode, and m represents the electron mass, so that the actual speed $v=\int_0^t a dt$ and the transition time t (t=L/v) which are obtained by accelerating the former electronics emitted from the cathode are different from that of the latter electronics. When the voltage of the accelerating pole is gradually increased, the latter emitted electronic will get a greater speed and catch up with the former electronic, so as to shrink the entire signal period. When the voltage of the accelerating pole is gradually weakened, the latter emitted electronic will obtain a less speed and further get behind with the former electronic, so as to expand the entire signal period. Assuming that the speed of the initial emitted electronic is $v_{start}$, the speed of the final emitted electronic is $v_{end}$, and the time interval from the initial emitted electronic to the final emitted electronic is $T_0$, then the time gain of the electronic after linear acceleration or linear deceleration is:

$$A_T = \frac{\frac{L}{v_{end}} - \frac{L}{v_{start}}}{T_0}.$$

When the electron beam flow is linearly accelerated (ascending or descending), although the former electron beam and the latter electron beam flow have the different speeds, the acceleration (or deceleration) will reduce (increase) the spatial distribution density of the electronics, both of which are complementary. Thus, there is no need to collimate and correct the electron beam flow, so as to simplify the system structure and the overall cost of the hardware.

Referring to FIG. 4, the period stretch device assembly for ultra-fast serial-to-parallel/parallel-to-serial conversion includes a target signal serial-to-parallel/parallel-to-serial conversion device and a signal period stretch device. One end of each of multiple signal period stretch devices is used as an interface of the target signal to input/output the target signal in parallel, and the other end is connected in parallel to the target signal serial-to-parallel/parallel-to-serial conversion device.

The ultra-fast serial-to-parallel/parallel-to-serial conversion achieves the serialization staggered layout of operating time interval of each channel, and thus the method of delaying transmission synchronization (serialization staggered) and directly regulating the phase difference of the target signal and so on can be used. In this embodiment, the method of delaying control signal of each channel in the signal period stretch device, but the implementation is not limited to use this method. This embodiment uses a combination mode of three channels (CH1/CH2/CH3), and the three channels are circularly adjacent and each channel occupies one-third of a work period. Thus, no matter how many channels are used, in order to achieve the purpose of uninterruptedly stretching signals, the effective operating time interval of each channel must be adjacent or overlapped (the period of the output signals can not be overlapped when the signal is shrunk), until the processing task ends. In this embodiment, the operating time interval of each channel that is in symmetrical work state and is absolute adjacent to each other is just easy to simplify the description of the work process of each channel. Thus, the combination modes are not limited to the above combination mode, and the channels can work in non-completely symmetrical state, and different ratio of forwards work and backwards work, and the overlap of the effective operating time interval of each channel, and so on.

Now, the target signal expansion is taken here as an example to illustrate the operational principle of the period stretch device assembly of the ultra-fast serial-to-parallel/parallel-to-serial conversion. In the case that the signal period stretch device assembly works in the serial-to-parallel mode, the target signal is not distributed by being divided into some segments and distributing the segments to each channel. Instead, the target signal is divided into a plurality of total same identical target signals by the target signal serial-to-parallel/parallel-to-serial conversion device, and the divided target signals are output to each of the signal period stretch devices. The external control signal generator provides the control signals with different time delays for each of the signal period stretch device, thereby controlling the signal period stretch devices to expanding the target signals for different time intervals. Since any two operating intervals of the forwards work of the signal period stretch device are overlapped or adjacent, and meet circularly adjacent, so that the signal period stretch device can continuously expand the period of the target signal, and each channel will contain a combination of the expanded signal and the shrunk signal therein after the expansion processing. A selector or low-pass filter can be used here to select the expanded signal as the output signal. Because the signals are segmented and distributed, and expanded, so that the total period of the signal is greater than the period of the original signal. The signals are output in the parallel form to implementing the transmission and measurement of common electronic devices. The segmented and parallel signals need to implement inverse transformation of spectrum and timing sequence according to original spectrum and timing sequence of the signal content. The inverse transformation herein is only a virtual transformation used for the value operation or analysis, because the physical inverse transformation need to carry out a spectrum restoration (however, if the period of the signal is used as the reference value related to time, the signal curve and the relative spectrum will not generate any changes). If the spectrum is restored, the working speed of the common device cannot meet the requirements; but if the spectrum is not restored and the signal period is expanded, a longer time is needed to output all the information of entire original signals. Therefore, the method of segmenting and outputting the target signals in parallel can save the time for outputting the signal.

In the case that the signal period stretch device assemble of the ultra-fast serial-to-parallel/parallel-to-serial conversion works in the parallel-to-serial mode, the target signal is shrunk and delayed by each of the signal period stretch devices, and the target signals in different channels are gathered in the same transmission path by the target signal serial-to-parallel/parallel-to-serial conversion devices. The target signals from different channels are delayed by the delayers, the delayed target signals are gathered in the same transmission path without aliasing. The high-speed devices are not directly involved in the synthesis control of the target signals in the different transmission path (in this embodiment, the method of optical focusing and collimating is used for serializing signal arrangement and also this structure can diffuse the serial signal to multi-channel signal paths). Therefore, by the assemble, the problem of utilization ratio of the wave sequence at the lower frequency and the problem of the control of wave sequence at the higher frequency are solved, so as to improve the data transmission rate of the single-channel.

When the target signal is electromagnetic waves, the target signal serial-to-parallel/parallel-to-serial conversion device performs the focus and collimation by the optical lens or curved surface reflector. When the target signal is the electronics, the electronic optical lens can be used. When the target signal is the light wave, the delayer can, but not limited to, glass. When the target signal is the electronics or an electrical signal, the delayer can be replaced by the transmission line to put off transmission actions (i.e., the transmission distances of the signals are not equal). When the target signal is the light wave, the selector can be a diachronic mirror or beam splitter. When the target signal is electronics, the low-pass filter or the method of shortest response time of the device can be used.

In summary, the numerous signals and their expression forms in the exemplary embodiment have been set forth in the foregoing description, but do not represent the constraints and limitations of the referred signals of this invention. In this embodiment, the highest frequency portion of the target signal is greater than 100 MHz, or the speed of the target signal in vacuum/air is greater than 10 Km/s. In the present disclosure, the signal can be an optical signal, an electrical signal, an electric field force signal, other basic power signal, or the signal parasitized on any kinds of physical particles. The existence form of the signal can be a periodic signal, a non-periodic signal, a continuous changing signal and a discrete signal. In cross-section of the transmission path, the signal can be a point-like single signal, a planar signal or a strip signal with infinite-channel. The control signal of this present disclosure can be, but not limited to, electrical signal, electromagnetic force or other types of signal. The application of the present invention is not specifically limited to signal processing and transmission, which includes the nuclear physics research, the signal sampling technique, the high-speed camera, the radar, the particle physics research, the synthesis of new substances, the light speed research, the spectrum shift lens, or the image variable-speed lens, signal synthesis, the artificial synthesis of the high-energy ray and other technology fields that are based on the application of the direct spectrum transformation of the source signals. The specific embodiments of this invention do not represent the constraints and limitations to achieve the means of the present invention. Means of achieving the present invention can be extended to any component and any implementations based on the invention principles and conceptions in the specification. The same types of signal period stretch devices can be connected in parallel or in series, and different types of signal period stretch devices can be connected to each other.

The invention claimed is:

1. A method for stretching a signal period, comprising:
   transmitting a target signal by a cathode of an electronic vacuum tube;
   changing a propagation speed of the target signal along a trajectory by using the vacuum electronic tube under the effect of a sawtooth wave signal, to expand or shrink the target signal, wherein the propagation speed of the target signal is proportional to a voltage of the sawtooth wave signal; and
   detecting and correcting the expanded or shrunken target signal by an electric current measuring and correcting and synchronizing circuit, to output the detected and corrected target signal;
   wherein the target signal passes through an accelerator for exerting an acting force on the target signal, according to the following orders, wherein the accelerator comprises a signal guided-in hole, a flow control pole, an acceleration pole, a guided-out hole or a flow detector or receiver, and a flow detection and correction unit:
   entering into the signal guided-in hole;
   passing through the flow control pole, wherein a flow of the target signal through the flow control pole is proportional to an amplitude of the control signal and a flow of the original target signal;
   the target signal entering into the accelerating field generated by a signal of the acceleration pole, where both a speed of the target signal entering into the accelerating field and a speed of the target signal leaving from the accelerating field are proportional to an intensity of the accelerating field during passing through the accelerating field; and
   after passing through the accelerating field, outputting the target signal on the signal guided-out hole or receiving by the flow detector or receiver, where the acting force on the target signal by the accelerating field is proportional to an amplitude of acceleration signal;
   when the target signal enters into the signal guided-in hole in an initial speed, the flow control signal generated by the flow control signal generator proportionally controls the flow rate of the target signal entered into the accelerating field, the controlled target signal enters into the accelerating field, and the intensity of the accelerating control signal is strengthened or weakened, to make a move speed of a latter target signal be faster/slower than that of a previous target signal to catch up/delay a previous control signal, and shrink and expand the period of the target signal.

2. The method according to claim 1, wherein
   the target signals are imported to the device by using a device of signal period stretch, wherein the device of signal period stretch comprises a high voltage supply and sawtooth wave signal generator with a terminal electrically connected to a ground, an electronic flow measuring and correcting and synchronizing circuit, and an electronic vacuum tube; and executing at least the following steps:
   connecting a target signal cable to the cathode of the electronic vacuum tube;
   forming an electron beam flow from the cathode to the target pole of the electronic vacuum tube under the control of attractive force of the high voltage on the high voltage anode of the electronic vacuum tube, wherein the value of the electron beam flow that is affected by the cathode-gate biasing voltage is proportional to the strength of the target signal and is inverse proportional to the voltage of the cathode-gate of the electronic vacuum tube;
   generating different transmit speeds for the electron entering into an accelerating field at different time by gradually increasing or decreasing the voltage of the electronic vacuum tube, to increase or decrease a distance of any two adjacent electron beam, and stretching or shrinking the period of the target signal in the electron beam flow, wherein the high voltage supply and sawtooth wave signal generator output an acceleration signal to the accelerating pole of the electronic vacuum tube and output a high voltage signal to the anode of the electronic vacuum tube;
   when reaching the anode, passing through a center hole of the anode and reaching the target pole; and then restoring the stretched electron flow signal in the electron beam flow to the target signal, and transmitting the restored target signal from the target pole to the electric current measuring and correcting and synchronizing circuit through a current output signal cable and outputting the target signal by a target signal output cable.

3. A device for stretching a signal period of a target signal, comprising:
   a first reflective panel configured with a first reflective surface;
   a second reflective panel configured with a second reflective surface, wherein the first reflective surface is arranged opposite parallel to the second reflective surface;
   a signal guided-in hole configured on the side of the first reflective panel;
   a signal guided-out hole configured on side of the first reflective panel or the second reflective panel;
   a resonant cavity configured between the first reflective panel and the second reflective panel;
   a controlled medium, arranged in the resonant cavity, comprising a first transmissive surface and a second transmissive surface, wherein the first transmissive surface is arranged opposite parallel to the first reflective surface and the second transmissive surface is arranged opposite parallel to the second reflective surface; and a controller, configured to emit a control signal to change a nature of the controlled medium and to control a propagation speed of the target signal in the controlled medium;

wherein the target signal is introduced via the signal guided-in hole, and output via the signal guided-out hole after multiply passing through the first transmissive surface and the second transmissive surface of the controlled medium in the resonant cavity and back and forth between the first reflection surface and the second reflection surface;

wherein the controller controls the target signal to propagate at a first propagation speed after entering into the controlled medium and to propagate at a second propagation speed before leaving the controlled medium, wherein the first propagation speed is different from the second propagation speed.

4. The device according to claim 3, wherein stretching the signal period comprises expanding and shrinking the target signal transmitted from an external signal source.

5. The device according to claim 4, wherein the signal period of the expanded or shrunk signal comprises a time interval of a continuous target signal and a time interval of a discontinuous target signal in the time.

6. The device according to claim 5, wherein in a process of the target signal passing through the first transmissive surface or the second transmissive surface of the controlled medium, the controller transmits a control signal which is continuously changing.

7. The device according to claim 3, wherein a distance between the first transmissive surface and the first reflective panel is $L_1$, a distance between the second transmissive surface and the second reflective panel is $L_2$, wherein $L_1=L_2$, and $$L_1=L_2 \geq \frac{1}{2}\int_0^{t_m} v_e dt$$

wherein $v_e$ is a propagation speed of the signal outside the controlled medium, $t_m$ is a time for the target signal to pass through the controlled medium.

8. A method for stretching a signal period of a target signal, applied to a device for stretching the signal period, wherein the device comprising:

a first reflective panel configured with a first reflective surface;

a second reflective panel configured with a second reflective surface, wherein the first reflective surface is arranged opposite parallel to the second reflective surface;

a signal guided-in hole configured on the side of the first reflective panel;

a signal guided-out hole configured on side of the first reflective panel or the second reflective panel;

a resonant cavity configured between the first reflective panel and the second reflective panel;

a controlled medium, arranged in the resonant cavity, comprising a first transmissive surface and a second transmissive surface, wherein the first transmissive surface is arranged opposite parallel to the first reflective surface and the second transmissive surface is arranged opposite parallel to the second reflective surface; and a controller, configured to emit a control signal to change a nature of the controlled medium and to control a propagation speed of the target signal in the controlled medium;

wherein the method for stretching the signal period comprises:

introducing the target signal via the signal guided-in hole;

controlling the target signal, by the controller, to propagate at a first propagation speed after entering into the controlled medium;

the target signal passing through the first transmissive surface of the controlled medium in the resonant cavity;

controlling the target signal, by the controller, to propagate at a second propagation speed before leaving the controlled medium;

the target signal passing through the second transmissive surface of the controlled medium in the resonant cavity;

the target signal passing through the first transmissive surface and the second transmissive surface of the controlled medium in the resonant cavity and back and forth between the first reflection surface and the second reflection surface;

outputting the target signal via the signal guided-out hole; and wherein the controller controls the target signal to propagate at a first propagation speed after entering into the controlled medium and to propagate at a second propagation speed before leaving the controlled medium, wherein the first propagation speed is different from the second propagation speed.

9. The method according to claim 8, wherein in a process of the target signal passing through the first transmissive surface or the second transmissive surface of the controlled medium, the controller transmits the control signal which is continuously changing.

* * * * *